United States Patent
Shimana et al.

(10) Patent No.: US 8,054,026 B2
(45) Date of Patent: Nov. 8, 2011

(54) SHORT CIRCUIT PHASE IDENTIFICATION METHOD

(75) Inventors: Tomoko Shimana, Nissin (JP); Hironari Kimura, Kariya (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 424 days.

(21) Appl. No.: 12/466,441

(22) Filed: May 15, 2009

(65) Prior Publication Data

US 2009/0284198 A1  Nov. 19, 2009

(30) Foreign Application Priority Data

May 15, 2008 (JP) ................................. 2008-128520

(51) Int. Cl.
*H02H 7/122* (2006.01)

(52) U.S. Cl. ...................................... 318/490; 318/558

(58) Field of Classification Search ............ 318/400.21, 318/434, 478, 490, 519, 558, 565, 638
See application file for complete search history.

(56) References Cited

U.S. PATENT DOCUMENTS

| 5,874,818 | A | * | 2/1999 | Schuurman | 318/400.04 |
| 5,914,582 | A | * | 6/1999 | Takamoto et al. | 318/801 |
| 6,160,414 | A | * | 12/2000 | Matsubara et al. | 324/537 |
| 6,369,543 | B1 | * | 4/2002 | Masselus et al. | 318/700 |
| 6,456,030 | B1 | * | 9/2002 | Masaki et al. | 318/700 |
| 6,683,435 | B1 | * | 1/2004 | Liang et al. | 318/727 |
| 7,355,436 | B2 |   | 4/2008 | Zehentner et al. | |

FOREIGN PATENT DOCUMENTS

| JP | 2004072997 | 3/2004 |
| JP | 2006246564 | 9/2006 |
| JP | 2007028733 | 2/2007 |

* cited by examiner

*Primary Examiner* — Bentsu Ro
(74) *Attorney, Agent, or Firm* — Gifford, Krass, Sprinkle, Anderson & Citkowski, P.C.

(57) ABSTRACT

A vehicle drive apparatus includes a battery that is a direct current power source, a converter that increases the voltage of the battery, an inverter connected to a motor that drives the vehicle, an inverter connected to a motor generator that functions as a motor or generator, and a motor control device that controls the motor. The vehicle drive device is also provided with a voltmeter, non-energized state determination devices that determine a non-energized state of the inverters, and ammeters that detect currents applied to a motor from each phase arm of the inverters. Signals of these devices and a signal from the non-energized state determination device are sent to the motor control device.

5 Claims, 8 Drawing Sheets

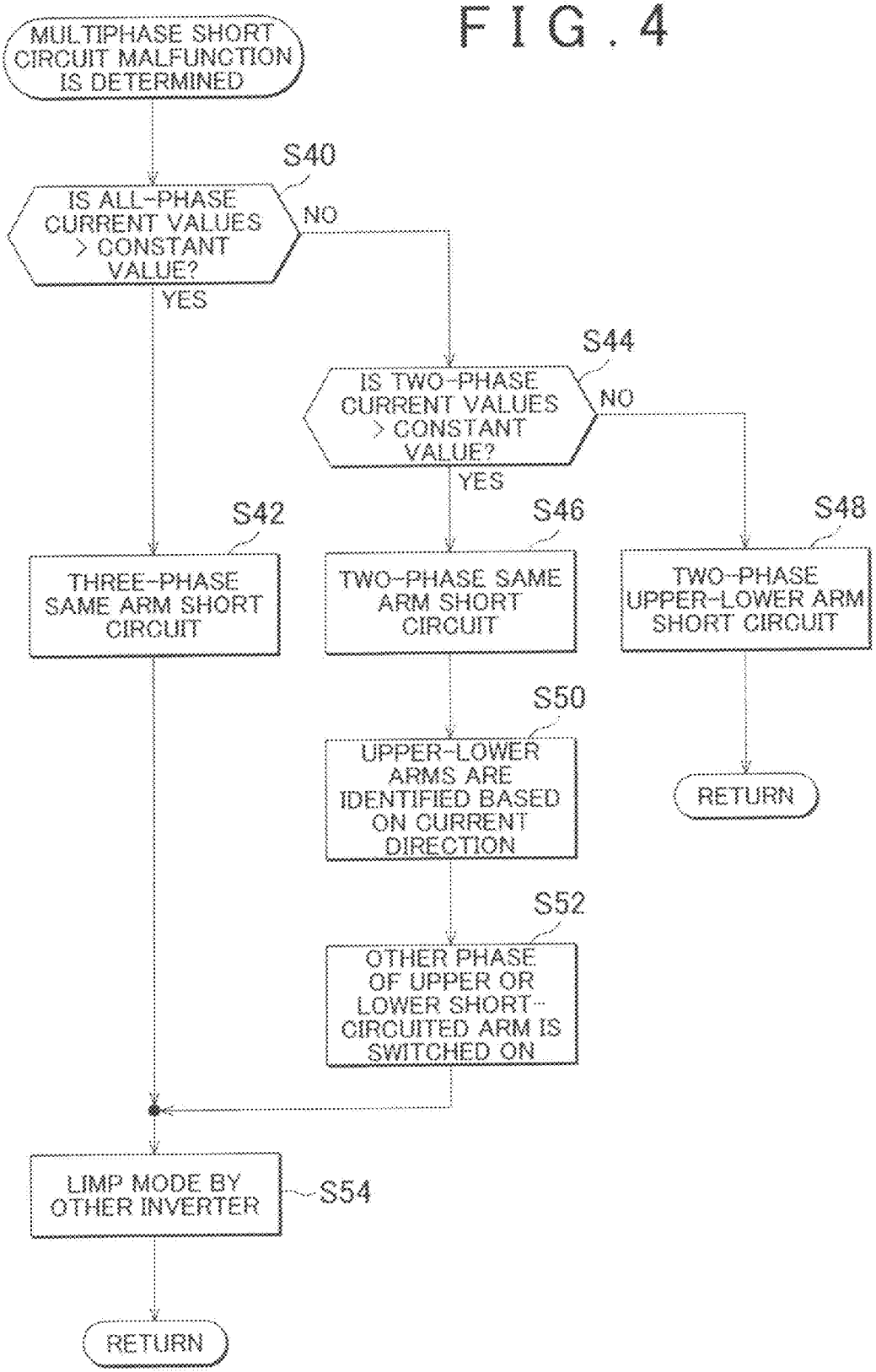

ONE-PHASE
SHORT CIRCUIT

TWO-PHASE
SHORT CIRCUIT

THREE-PHASE
SHORT CIRCUIT

SHORT CIRCUIT PHASE IDENTIFICATION METHOD

INCORPORATION BY REFERENCE

The disclosure of Japanese Patent Application No. 2008-128520 filed on May 15, 2008 including the specification, drawings and abstract is incorporated herein by reference in its entirety.

BACKGROUND OF THE INVENTION

1. Field of the Invention

This invention relates to a short circuit phase identification method for a motor control device of an electric automobile or a hybrid vehicle, and more particularly to a short circuit phase identification method for identifying a short circuit phase of a motor control device from an electric current generated by the rotation of a motor.

2. Description of the Related Art

A demand has recently grown for environmentally friendly electric automobiles and hybrid vehicles. In a hybrid vehicle, part of the engine power is transmitted to a drive shaft via a power distribution mechanism provided with a first motor generator. The remaining power is recovered as electric power by the first motor generator, and the recovered electric power may be used to charge a secondary battery or to drive a second motor generator.

In a motor control device of an electric automobile or a hybrid vehicle, an alternating current motor is used and feedback control of a drive current is performed for each phase. In the motor control device, a current offset is adequately detected from a detected signal of a current sensor, measuring accuracy of the current sensor may be enhanced by using a configuration in which the current is learned over time, and adequate feedback control, state monitoring of the motor generator, and malfunction detection are implemented.

In the above-described hybrid vehicle, for example, when a one-phase short circuit occurs in the first motor generator, a brake torque is applied to the engine by a torque in the reverse rotation direction and undesirable torque fluctuations sometimes occur. Accordingly, Japanese Patent Application Publication No. 2007-28733 (JP-A-2007-28733) discloses a feature that resolves a problem causing the brake torque when a short circuit malfunction occurs in the first motor generator.

Furthermore, Japanese Patent Application Publication No. 2006-246564 (JP-A-2006-246564) describes a feature relating to a malfunction diagnostic device that accurately detects a plurality of malfunction modes, more particularly to a malfunction diagnostic device that can distinguish between a malfunction occurring in a boost converter from that in an inverter circuit by using an offset-corrected current sensor.

JP-A-2007-28733 indicates that a three-phase short circuit control is executed, by which when one phase or two phases of a motor generator are short circuited, the remaining phase is also short circuited to obtain a three-phase short circuit state and the short circuit malfunction control means is provided to control the engine speed so that the rotational speed of the motor generator does not fall within a predetermined range after a short circuit malfunction occurs.

When a short circuit malfunction occurs in transistors provided above and below each phase arm of the inverter when one or two phases of the motor generator are short circuited, electric current flows even in a non-energized state. Consequently, the offset value of the current sensor is changed by zero point adjustment. The resultant problem is that fluctuations of the offset point when a malfunction has occurred adversely affects subsequent feedback control, state monitoring, and malfunction diagnostics.

SUMMARY OF THE INVENTION

The invention relates to a method for identifying a short circuit phase of a motor control device.

The first aspect of the invention relates to a short circuit phase identification method by which a short circuit phase of a motor control device is specified by a control signal of an inverter circuit including upper-stage and lower-stage transistors that switch and supply power to each phase of an alternating current motor installed on a vehicle and a current of each phase detected by current detectors that detect an electric current supplied to each phase of the alternating current motor. The method includes a non-energized state determination process of determining a non-energized state of each phase in a low-rotational speed state of the alternating current motor on the basis of the detected electric current of each phase; and a malfunction detection process of performing a smoothing processing of the detected current of each phase and determining that the inverter circuit has failed in a case where the non-energized state cannot be detected in the non-energized state determination process on the basis of a difference between a signal taking an absolute value of an electric current after the smoothing processing and a signal obtained by performing smoothing processing of an absolute value of the detected current of each phase and also on the basis of current levels of one-phase short circuit, two-phase short circuit, and three-phase short circuit that have been determined in advance.

In the short circuit phase identification method in accordance with the invention, the malfunction detection process may further include detecting whether a short circuit has occurred in the lower-stage or upper-stage transistor of the inverter circuit based on a direction of an electric current flowing in each short-circuited phase.

The short circuit phase identification method in accordance with the invention may further include a free rotation process of detecting a short-circuited transistor of the inverter circuit on the basis of information from the malfunction detection process and causing the alternating current motor to rotate using other a force other than electric power by switching on all the remaining upper-stage or lower-stage transistors on the detected transistor side.

The short circuit phase identification method in accordance with the invention may further include a re-detection process of supplying an electric power to the alternating current motor by another inverter circuit to drive a vehicle and again detecting the short-circuited phase by rotation of another alternating current motor in a case where the alternating current motor is set to a free rotation state by the free rotation process.

According to the short circuit phase identification method for identifying a short circuit phase of the motor control device, a short circuit phase or a failed transistor is identified when the inverter is failed, and not only the vehicle can be driven to the nearby service station, but also the malfunction can be repaired in a short time.

The second aspect of the invention relates to a malfunction determination device for an inverter circuit that includes upper-stage and lower-stage transistors that switch and supply power to each phase of an alternating current motor installed on a vehicle. The malfunction determination device includes current detectors that detect an electric current supplied to each phase of the alternating current motor; and a malfunction detection device that performs a smoothing processing of the detected current of each phase and determines that the inverter circuit has failed on the basis of a difference between a signal taking an absolute value of an electric current after the smoothing processing and a signal obtained by performing smoothing processing of an absolute value of the detected current of each phase and also on the basis of current levels of one-phase short circuit, two-phase short circuit, and three-phase short circuit that have been determined in advance, in a case where a non-energized state of each phase in a low-rotational speed state of the alternating current motor cannot be detected by the detected current of each phase.

BRIEF DESCRIPTION OF THE DRAWINGS

The features, advantages, and technical and industrial significance of this invention will be described in the following detailed description of the example embodiments of the invention with reference to the accompanying drawings, in which like numerals denote like elements, and wherein:

FIG. 4 is a flowchart illustrating the a process executed by the motor control device for determining whether a multi-phase short circuit malfunction has occurred according to the present embodiment;

DETAILED DESCRIPTION OF EMBODIMENTS

The best mode for carrying out the invention (referred to hereinbelow as "embodiment") will be explained below with reference to the appended drawings.

Figure 1:
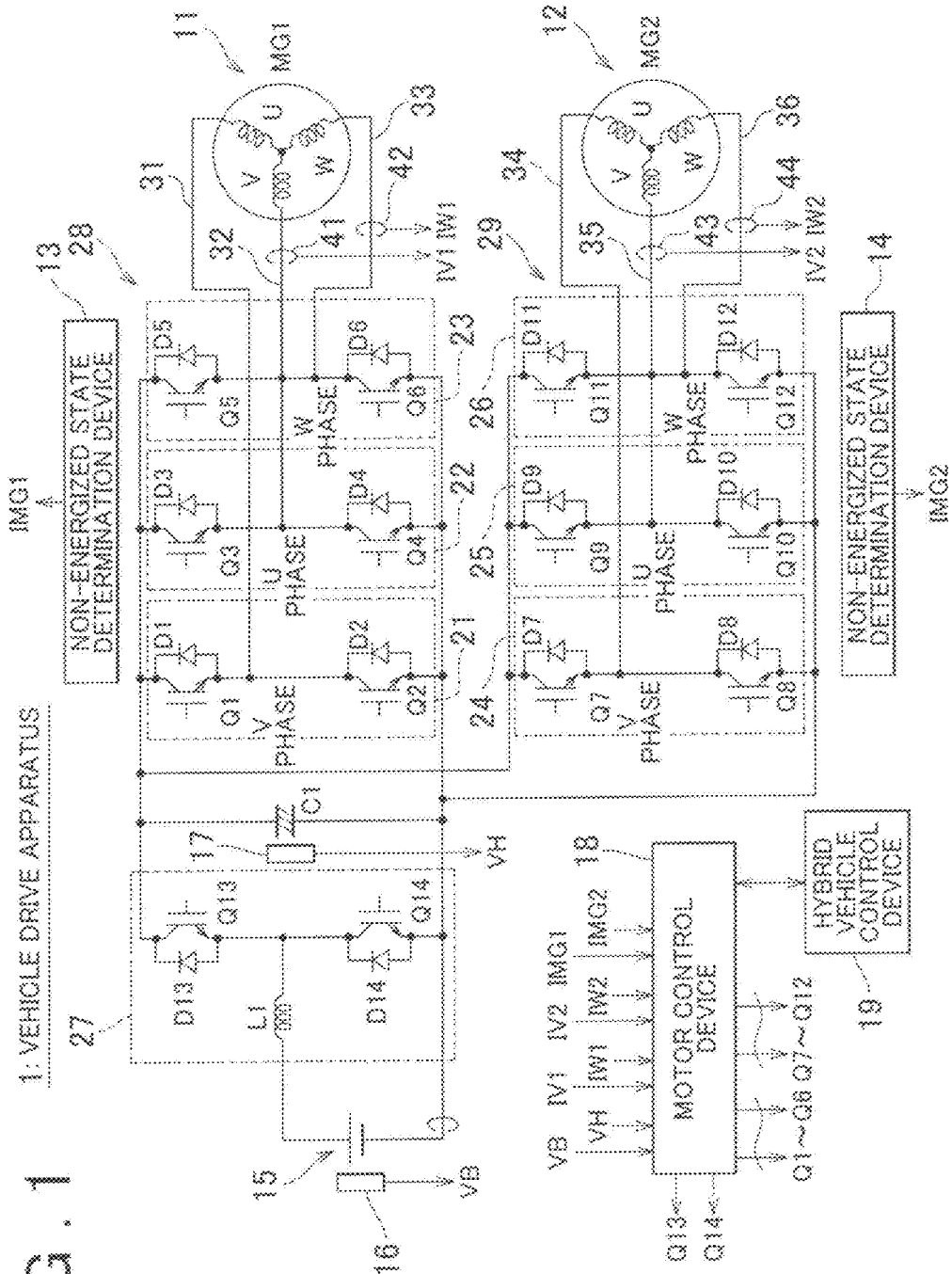
FIG. 1 shows the entire configuration of the vehicle drive apparatus including a motor control device according to the present embodiment.

FIG. 1 illustrates the entire configuration of a vehicle drive apparatus 1 installed on an electric automobile or a hybrid vehicle and shows a vehicle drive apparatus 1 including a motor control device 18. The vehicle drive apparatus 1 includes a battery 15 that is a direct current power source, a converter 27 that rises a voltage of the battery 15, an inverter 28 connected to a motor 11 (MG1) that drives the vehicle, an inverter 29 connected to a motor generator 12 (MG2) that functions as a motor or generator, the motor control device 18 that controls these motors, and an hybrid vehicle control device 19 that controls the motor control device 18.

The vehicle drive device 1 is also provided with non-energized state determination devices 13 and 14 determine whether the inverters 28 and 29 are in a non-energized state, a voltmeter 16 that detects a battery voltage VB, a voltmeter 17 that detects a raised voltage VH, and ammeters 41, 42, 43, and 44 that detect currents applied to a motor from each phase arm 31 to 36 of the inverters, respectively. Signals of these devices and IMG1 and IMG2 signals from the non-energized state determination devices 13 and 14 are sent to the motor control device 18.

An insulated gate bipolar transistor (IGBT), which is a high-current transistor, is disposed above and below the converter 27 and inverters 28 and 29. A diode is connected in parallel with each IGBT, and arm modules 21 to 26 having phase arms are configured. The inverters 28 and 29 are connected via a smoothing capacitor C1 to a converter 27 that includes a reactor L1 and an IGBT.

The motor control device 18 actuates the converter 27 or inverters 28 and 29 by outputting a drive signal to each IGBT Q1 to Q14. Phase arms 31 to 36 are connected to the motor 11 or motor generator 12, an electric current applied to the motor or the like is detected by the ammeters 41, 42, 43, and 44, and the detected current is output to the motor control device 18 and non-energized state determination device 13.

The non-energized state determination devices 13 and 14 determine whether the invertors 28 and 29 is are in a normal non-energized state based on whether a drive signal is supplied to each IGBT of the inverters 28 and 29 controlled by the motor control device 18 and the current detected by each ammeter and outputs the determination signal IMG1 and IMG2 to the motor control device 18. In the inverters 28 and 29, one of the lower and upper IGBT is switched ON after the other of the lower and upper IGBT in an ON mode so as to prevent the lower and upper IGBT from being simultaneously switched ON. Therefore, when the rotational speed is low and the IGBT are normally actuated, the non-energized state is detected.

The motor control device 18 drives the motor 11 or motor generator 12 by actuating the converter 27 and inverters 28 and 29 in accordance with instructions from the hybrid vehicle control device 19, which is a higher-level control device.

Figure 2A:
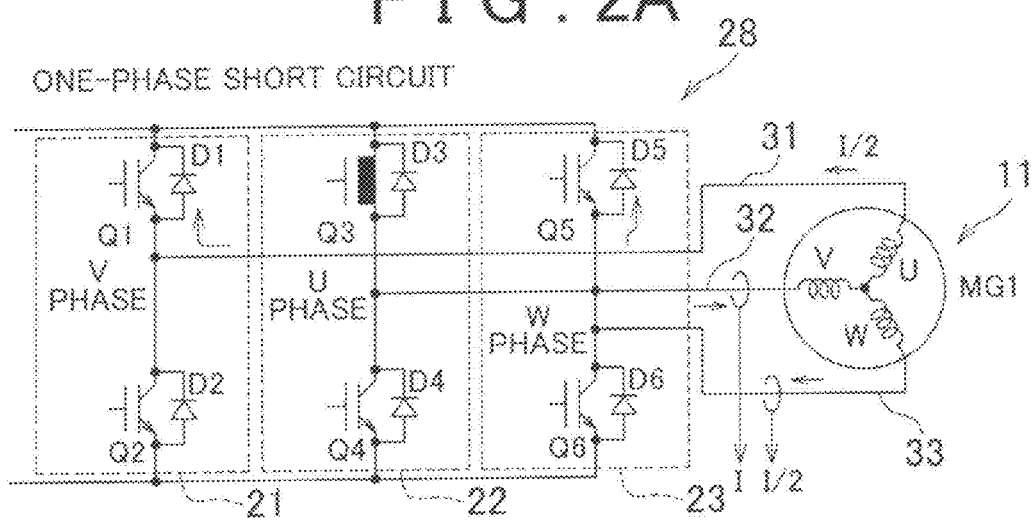
FIGS. 2A to 2C are explanatory drawings illustrating a short circuit in the configuration diagram of the main electronic circuit of the vehicle drive apparatus.
Figure 2B:
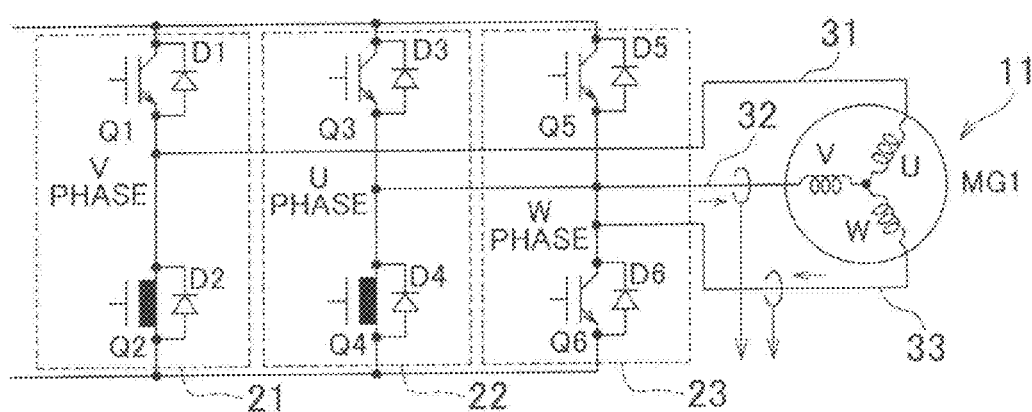
Figure 2C:
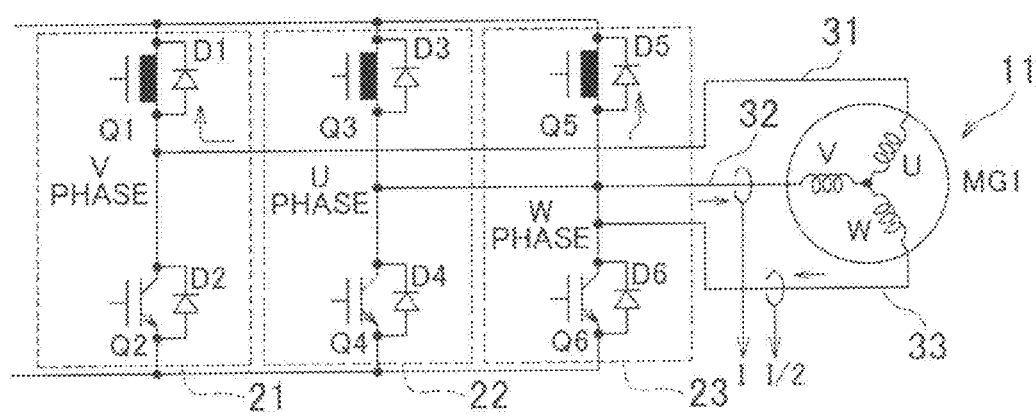
Figure 5A:
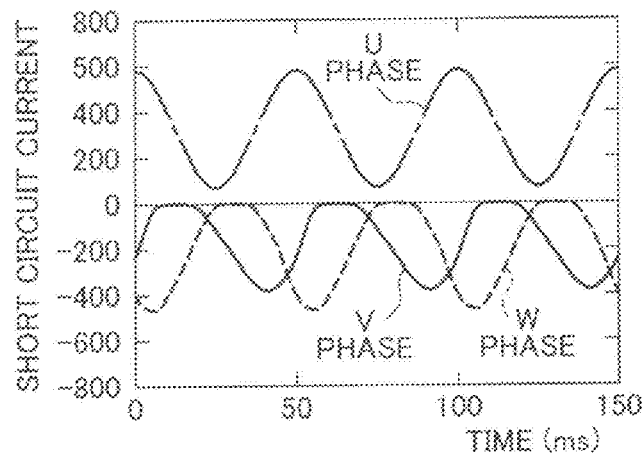
FIGS. 5A to 5C illustrate variations of short circuit current waveforms in the vehicle drive apparatus.
Figure 5B:
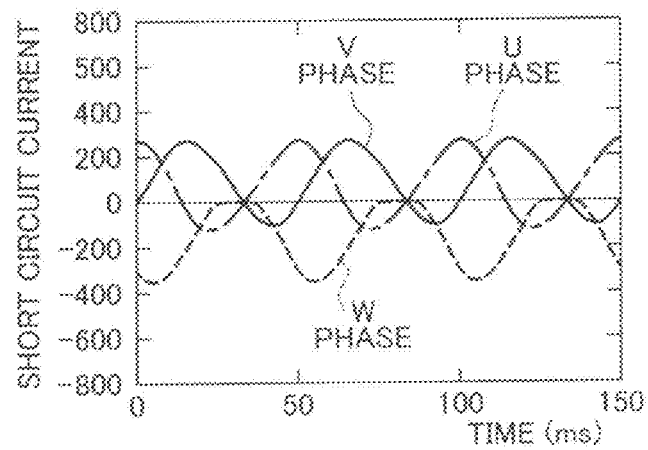
Figure 5C:
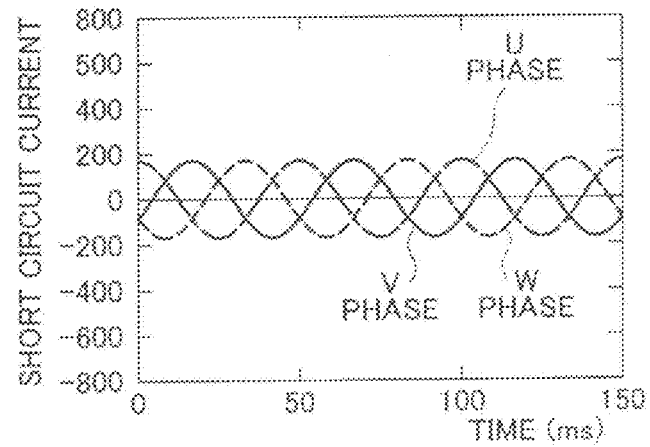

FIGS. 2A to 2C show a short circuit malfunction of the main electronic circuit of the vehicle drive device 1, and FIGS. 5A to 5C show variations in a short circuit current waveform in the vehicle drive device 1. FIGS. 2A and 5A show a one-phase short circuit in the U phase alone, FIGS. 2B and 5B show a two-phase short circuit in the V phase and the U phase, and FIGS. 2C and 5C show a three-phase short circuit in the V phase, the U phase, and the W phase. In the main electronic circuit shown in FIGS. 2A to 2C, the inverter 28 that is connected to the converter 27 has a V-phase arm 31, a U-phase arm 32, and a W-phase arm 33. When a one-phase short circuit occurs, shown in FIG. 2A, the IGBT Q3 of the U-phase arm 32 is short circuited and other IGBT are in an OFF state.

Where the IGBT Q3 is short circuited in a one-phase short circuit state shown in FIGS. 2A and 5A, a circulating current flows from the IGBT short circuited on the upper side of each arm and the anode side of diodes D1 and D5 to the cathode side. Assuming that a current I flows in the short circuited IGBT Q3, a current of I/2 will flow in each of the V-phase diode D1 and W-phase diode D5. In the two-phase short circuit state shown in FIGS. 2B and 5B, the V phase and U phase are short circuited and a combined current flowing in the IGBT with short circuited V phase and U phase will flow in the W-phase diode. Furthermore, in the three-phase short circuit state shown in FIGS. 2C and 5C, the V-phase, U-phase, and W-phase IGBT are short circuited. Therefore, the current flow is distributed in three diodes, thereby producing the circulating current such as shown in FIG. 5C.

Figure 3:
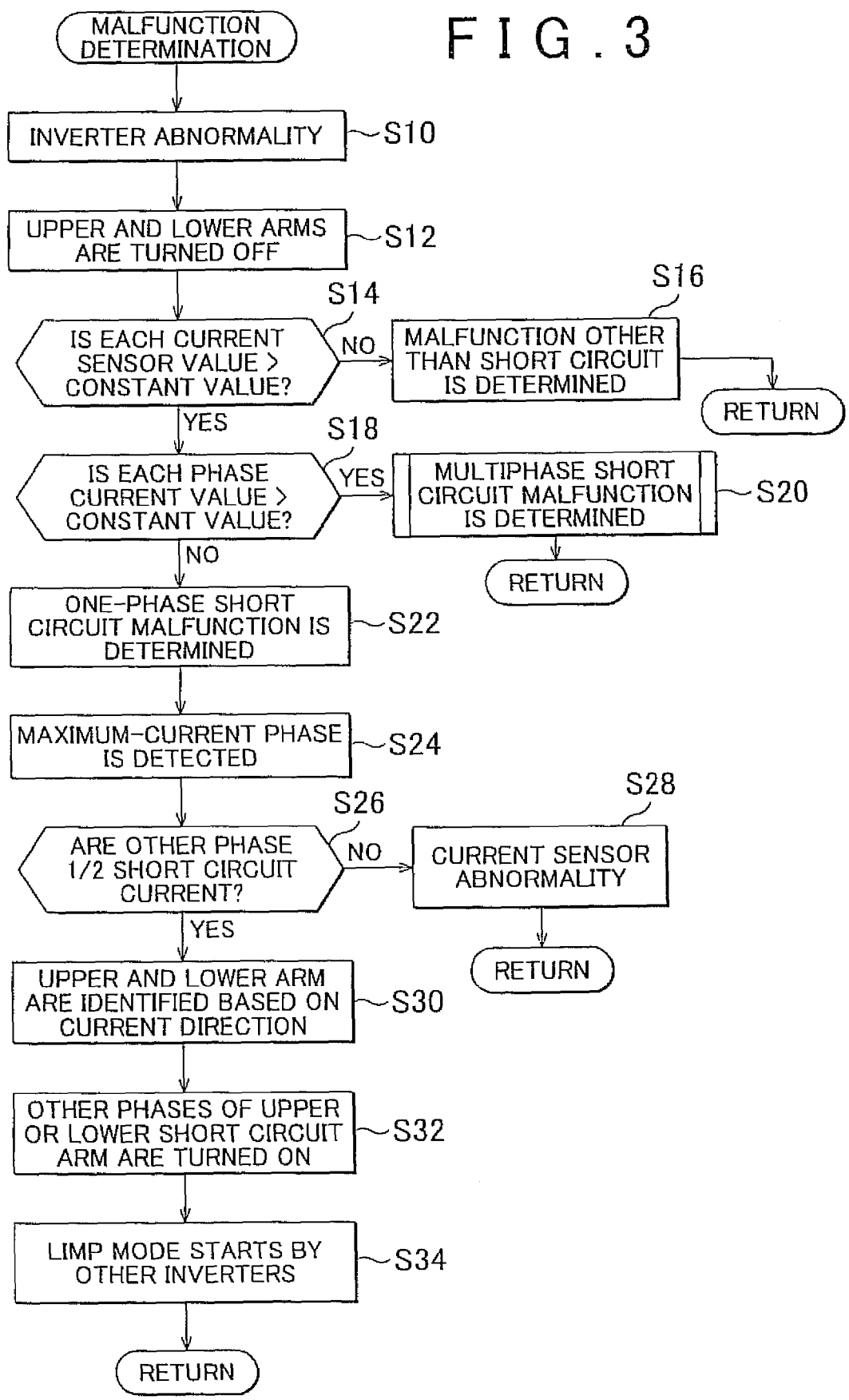
FIG. 3 is a flowchart illustrating a process executed by the motor control device for determining whether an inverter malfunction has occurred, according to the present embodiment.

FIG. 3 shows the process of determining whether an inverter malfunction has occurred that is executed in the motor control device 18. FIG. 4 shows the process of determining whether an inverter malfunction has occurred. The malfunction determination process is started when an abnormality is detected in the inverter based on determination signals from non-energized state determination devices 13 and 14 in a low rotational speed mode in step S10. Then, in step S10, if the inverter abnormality is again detected after all the IGBT have been switched off, a zero-point adjustment executed in a low-rotational speed mode of the motor 11 or motor generator 12 shown in FIG. 1 is stopped. Then, a subsequent current value is detected using the preceding zero point information and the IGBT of the upper and lower arms are set in an OFF state in step S12. As a result, if the motor is freely rotated by an external force, a circulating current will be generated, as shown in FIGS. 5A to 5C.

In step S14, V-phase and W-phase electric currents are detected by current sensors 41 and 42, and the current of the remaining U phase is calculated from the V-phase and W-phase currents. If the obtained currents are larger than a predetermined lowest detectable current, it is determined that a short circuit malfunction is possible and the process moves to step S18. If the current values are equal to or below the lowest detectable current, it is determined in step S16 that a malfunction other than a short circuit has occurred, and the process returns to the main routine.

If it is determined that a short circuit malfunction is a possibility, the failed IGBT may be identified by determining current level in each phase in step S18. An equation relating to a case in which the level of each sent current is determined is shown below. "A converging absolute value" and "an absolute converging value" obtained by two smoothing processing operations are specific features of the present embodiment.

(1) Converging absolute value: a value obtained by taking an absolute value of a signal obtained by smoothing processing and selecting it as a positive current value at all times.

$|Bn+1|$=(Present value $Bn$–Previous converging value $Bn-1$)/Converging constant*Sampling time+ Previous converging value $Bn-1$)  (Equation 1)

(2) Absolute converging value: a value picked out by performing smoothing in which a signal used in smoothing processing is taken as an absolute value.

$Cn+1$=(|Present value $Cn$|–Previous converging value $Cn-1$)/Converging constant*Sampling time+ Previous converging value $Cn-1$  (Equation 2)

(3) Differential current: in a current value of an alternating current, the difference between the absolute converging value obtained with Equation 1 and the converging absolute value having a positive or negative value obtained with Equation 2 has a predetermined value and is not zero. Therefore, one-phase short circuit, two-phase short circuit, and three-phase short circuit are determined by a current level by using the differential current value.

$Dn$=(Absolute converging value $Cn$–Converging absolute value $Bn$)  (Equation 3)

Figure 6A:
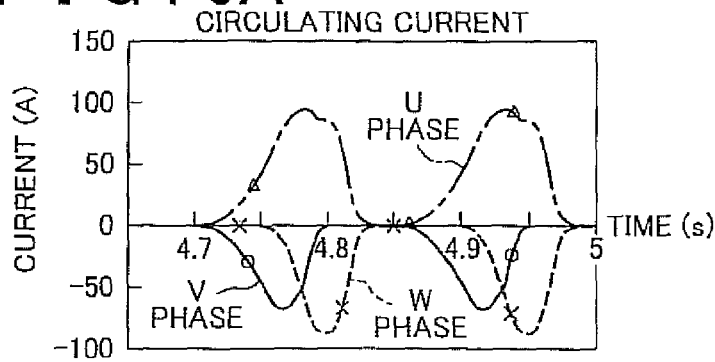
FIGS. 6A to 6D illustrate an example of one-phase short circuit current waveform in the vehicle drive apparatus.
Figure 6B:
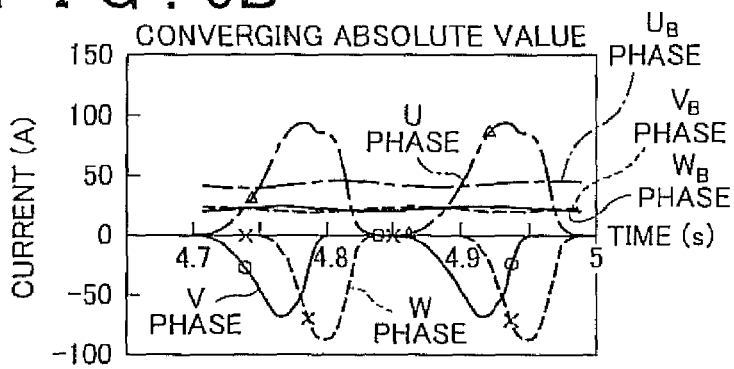
Figure 6C:
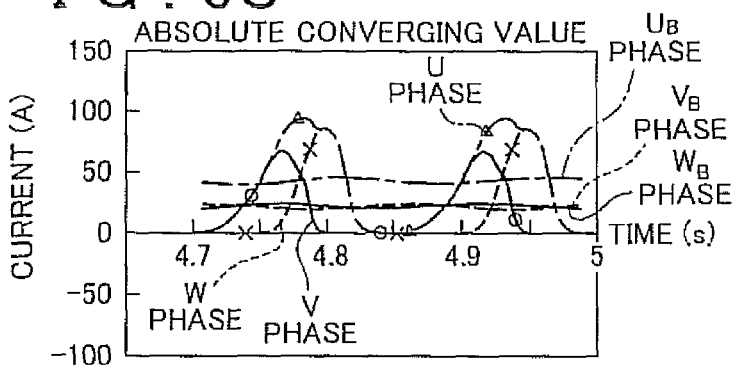
Figure 6D:
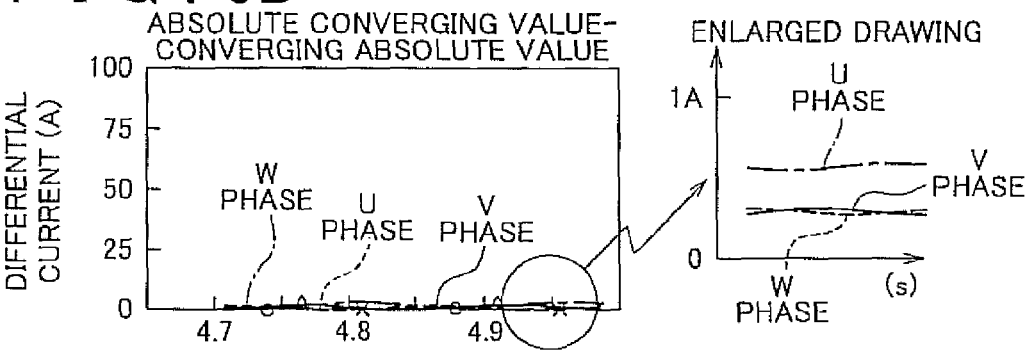

FIGS. 6A to 6D show an example of one-phase short circuit current waveform in the vehicle drive apparatus, and FIGS. 7A to 7D show an example of two-phase short circuit current waveform. The waveforms shown in FIGS. 6A to 6D and FIGS. 7A to 7D are current waveforms obtained when the motor has a low rotational speed (for example, about 100 rpm); a current value detected by the current sensor is plotted against the ordinate and time is plotted against the abscissa. FIG. 6A shows a value detected by the current sensor, FIG. 6B shows a converging absolute value, FIG. 6C shows an absolute converging value, and FIG. 6D shows a differential current. The process executed during a malfunction of the inverter 28 shown in FIG. 1 will be described below.

In step S18 shown in FIG. 3, the differential current is compared with an empirically determined constant, and if the differential current is larger than the constant, it is determined that a multiphase short circuit malfunction has occurred. Accordingly, the processing advances to step S20 and then moves to the below-described multiphase short circuit malfunction determination. If the differential current is equal to or less than the constant value, the process proceeds to step S22 for one-phase short circuit determination to determine whether a one-phase short circuit has occurred.

In step S22, differential currents in U phase, V phase, and W phase are calculated and then the average value of the differential current in each phase over a predetermined time is calculated. A maximum current phase is then selected from among the average values of differential current of each phase in step S24. For example, FIG. 6D and an enlarged drawing thereof demonstrate that a phase with the largest current from among the U phase, V phase, and W phase is the U phase. In step S26, it is determined whether the current flowing through the other two phases is equal to ½ the short circuit current, and if it is determined that the current flowing through the other two phases is equal to ½ the short circuit current, the process proceeds to step S30. If the current closing through the two other phases is not ½ the short circuit current, it is determined that a current sensor malfunction has occurred in step S28 and the process returns to the main routine.

In step S30, which the upper or lower arm is identified based on the flow direction of the U-phase current, and in step S32, the V phase and W phase of the identified upper or lower short circuit arm side is turned on, motor drag is prevented, and a free rotational speed state is assumed. Then, in step S34, the motor generator 12 is driven by another inverter 29 shown in FIG. 1, a limp mode starts, and the process returns to the main routine. The constant used in determining whether a one-phase short circuit has occurred, as described above, becomes a low differential current value, as shown in FIG. 6D. Therefore, the zero-point adjustment at the time of malfunction has to be stopped for measurements.

Figure 7A:
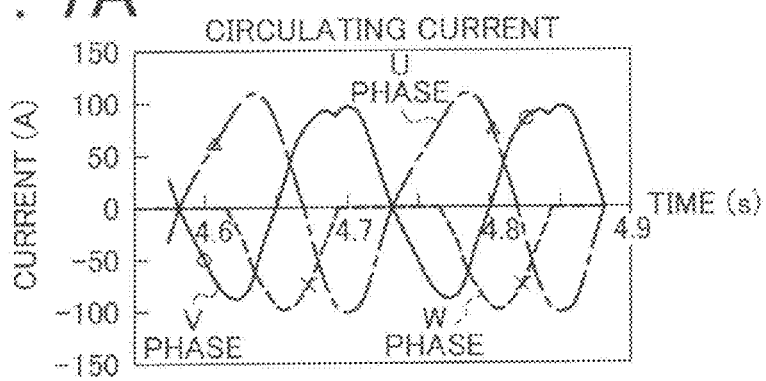
FIGS. 7A to 7D illustrate an example of two-phase short circuit current waveform in the vehicle drive apparatus.
Figure 7B:
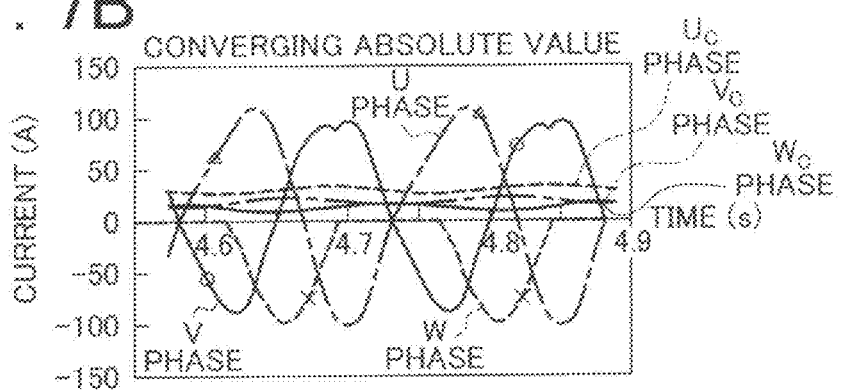
Figure 7C:
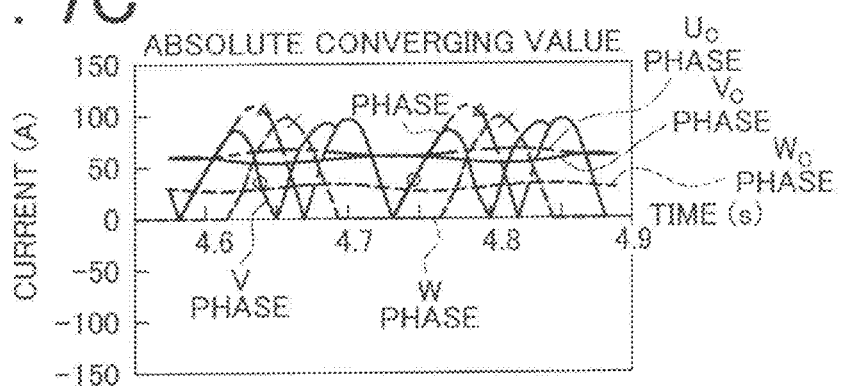
Figure 7D:
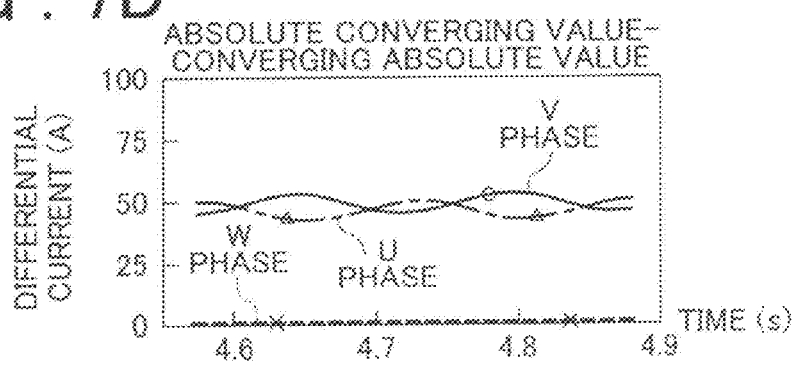

FIG. 4 shows a process of determining whether a multiphase short-circuit has occurred. FIGS. 7A to 7D show a two-phase short circuit current waveform. The frequency at which two-phase short circuits or three-phase short circuits occur is very low, but a two-phase short circuit is shown as one example. FIG. 7A shows a two-phase short circuit current waveform in a two-phase short circuit of U phase and V phase. If all the phase current values (U phase, V phase, and W phase) exceed the constant in step S40, it is determined that a three-phase same side arm short circuit has occurred, namely a short circuit has occurred in the each of U phase, V phase, and W phase on the same arm side (upper arm or lower arm), and the process moves to step S42. The process then returns to the main routine to start the limp mode in the other inverter 29 in step S54.

If only two-phase current values (U phase and V phase) exceed a constant value in step S40, it is determined in step S46 that a two-phase same side arm short circuit has occurred. If the two-phase current value is equal to or below constant value in step S44, the process moves to step S48, where it is determined that a two-phase upper and lower arm short circuit has occurred. The process then returns to the main routine.

If it is determined in step S46 that a two-phase same side arm short circuit has occurred, the upper and lower arms are identified based on the direction of current in step S50, the other phase of the upper or lower short-circuited arm is turned on in step S52, the process moves to step S54, and the malfunction determination processing is ended. The process then returns to the main routine to execute the retraction motion in the other inverter 29.

Figure 8:
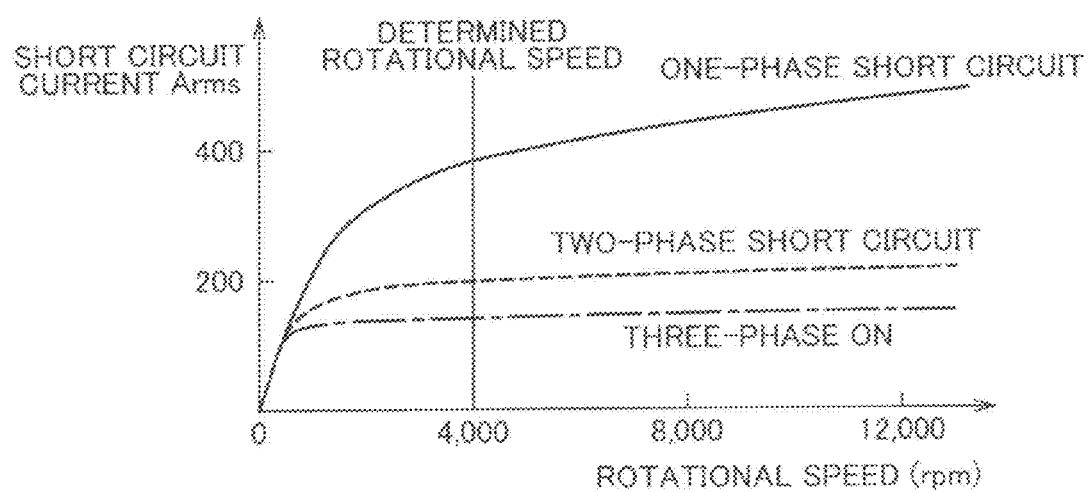
FIG. 8 illustrates the relationship between a short circuit current waveform and the rotational speed of the motor from one-phase short circuit to three-phase ON (no-phase short circuit).

FIG. 8 shows the relationship between a short circuit current waveform and rotational speed of the motor within an interval from a one-phase short circuit to a three-phase ON (or three-phase short circuit) in a driven system when the retraction motion has been performed in the other inverter. As shown in FIG. 8, if the rotational speed of the motor exceeds about 1,000 rpm, the short circuit current values of one-phase short circuit, two-phase short circuit, and three-phase ON differ significantly from one another, and the one-phase short circuit, two-phase short circuit, and three-phase ON states may be differentiated based on the relationship between the rotational speed and short circuit current of the motor.

Accordingly, in the present embodiment, more accurate determination is implemented by rechecking the results of determination obtained with the process of inverter malfunction determination with the motor control device 18 shown in FIG. 3, for example, by determining in a low-rotational speed region close to 4,000 rpm by using the characteristic shown in FIG. 8.

As described above, with the motor control device of the present embodiment, accurate malfunction determination and short circuit phase identification can be performed. Furthermore, not only can the vehicle be driven to a nearby service station, but also the malfunction may be repaired in quickly. Various waveforms and numerical values that are used only for purposes explaining the present embodiment are not limiting and may be adjusted according to vehicle parameters.

What is claimed is:

1. A short circuit phase identification method by which a phase of a motor control device in which a short circuit has occurred is identified by a control signal of an inverter circuit that includes upper-stage and lower-stage transistors, which switch and supply an electric power to each phase of an alternating current motor installed on a vehicle, and a current of each phase detected by current detectors that detect an electric current supplied to each phase of the alternating current motor, the method comprising:
    a non-energized state determination process of determining whether each phase is non-energized when the alternative current motor is in a low-rotational speed state, based on the current detected in each phase; and
    a malfunction detection process of smoothing the detected current of each phase and determining whether the inverter circuit has malfunctioned if the non-energized state cannot be detected in the non-energized state determination process, based on a difference between a signal taking an absolute value of an electric current after the smoothing process and a signal obtained by smoothing an absolute value of the detected current of each phase, and also based on predetermined current levels of one-phase short circuit, two-phase short circuit, and three-phase short circuit.

2. The short circuit phase identification method according to claim 1, wherein the malfunction detection process further comprises:
    detecting whether a short circuit has occurred in the lower-stage or upper-stage transistor of the inverter circuit based on a direction of an electric current flowing in each short-circuited phase.

3. The short circuit phase identification method according to claim 1, further comprising:
    the free rotation process of detecting a short-circuited transistor of the inverter circuit based on information from the malfunction detection process and causing the alternating current motor to rotate using a force other than electric power by switching on all the remaining upper-stage or lower-stage transistors on the detected transistor side.

4. The short circuit phase identification method according to claim 3, further comprising:
    supplying an electric power to the alternating current motor by another inverter circuit to drive a vehicle and again detecting the short-circuited phase by rotating another alternating current motor if the alternating current motor is set to a free rotation state by the free rotation process.

5. A malfunction determination device for an inverter circuit that includes upper-stage and lower-stage transistors, which switch and supply power to each phase of an alternating current motor installed on a vehicle, the malfunction determination device comprising:
    current detectors that detect an electric current supplied to each phase of the alternating current motor; and
    a malfunction detection device that smoothes the detected current of each phase and determines whether a malfunction has occurred in the inverter circuit based on a difference between a signal taking an absolute value of the smoothed electric current of each phase and a signal obtained by smoothing the absolute value of the detected current of each phase, and predetermined current levels in one-phase short circuit, two-phase short circuit, and three-phase short circuit, if a non-energized state of each phase in a low-rotation state of the alternating current motor cannot be detected based on the detected current of each phase.

* * * * *